(12) United States Patent
Hoshino (10) Patent No.: US 6,265,310 B1
(45) Date of Patent: *Jul. 24, 2001

(54) METHOD OF FORMING CONTACT HOLES ON A SEMICONDUCTOR SURFACE

(75) Inventor: Kazuhiro Hoshino, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/098,059

(22) Filed: Jun. 16, 1998

Related U.S. Application Data (62) Division of application No. 08/838,176, filed on Apr. 16, 1997, now abandoned, which is a continuation of application No. 08/417,999, filed on Apr. 6, 1995, now abandoned.

(30) Foreign Application Priority Data

Apr. 25, 1994 (JP) ................................. P06-109079

(51) Int. Cl.$^7$ ............................................ H01L 21/4763
(52) U.S. Cl. ...................... 438/641; 438/642; 438/646; 438/648
(58) Field of Search .................................. 438/641, 648, 438/642, 646

(56) References Cited

U.S. PATENT DOCUMENTS

| | | | |
|---|---|---|---|
| 4,686,759 | * 8/1987 | Pals et al. | 437/51 |
| 4,816,098 | * 3/1989 | Davis et al. | 156/345 |
| 4,832,778 | * 5/1989 | Davis et al. | 156/345 |
| 4,963,512 | * 10/1990 | Iwanaga et al. | 437/192 |
| 5,093,279 | * 3/1992 | Andresshak et al. | 437/173 |
| 5,182,231 | * 1/1993 | Hongo et al. | 437/173 |
| 5,192,713 | * 3/1993 | Harada | 437/192 |
| 5,210,053 | * 5/1993 | Yamagata | 437/192 |
| 5,266,522 | * 11/1993 | DiGiacomo | 437/192 |

FOREIGN PATENT DOCUMENTS

5082519 * 4/1993 (JP) ....................... 437/60

\* cited by examiner

*Primary Examiner*—Olik Chaudhuri
*Assistant Examiner*—Shrinivas Rao
(74) *Attorney, Agent, or Firm*—Sonnenschein, Nath & Rosenthal (57) ABSTRACT

A method of manufacturing a semiconductor device utilizing a multi-chamber apparatus comprises the steps of forming a metal film on an insulating layer under the lower pressure within a film forming apparatus and reflowing the metal film on the insulating film, after transferring the semiconductor substrate to a reflow apparatus from the film forming apparatus under the vacuum atmosphere of $1.3\times10^{-6}$ Pa or less, by simultaneously heating a plurality of semiconductor substrates under the vacuum atmosphere of $1.3\times10^{-6}$ Pa or less.

7 Claims, 8 Drawing Sheets

METHOD OF FORMING CONTACT HOLES ON A SEMICONDUCTOR SURFACE

This application is a divisional of application Ser. No. 08/838,176, filed on Apr. 16, 1997, now abandoned, which is a continuation of application Ser. No. 08/417,999, filed on Apr. 6, 1995, now abandoned.

BACKGROUND OF THE INVENTION

1. Field of the Invention

The present invention relates to a multi-chamber apparatus which is suitable for formation of contact holes, for example, in the semiconductor device manufacturing process and a method of manufacturing a semiconductor device.

2. Description of the Related Art

Improvement in packing density of VLSI requires further miniaturization of contact holes for electrically connecting a semiconductor substrate and wirings formed thereon and via holes and through holes for electrically connecting multi-layer interconnections. In the 0.25 μm rule, the aspect ratio of these contact holes, via holes or through holes (hereinafter generally called a connecting hole) is larger than 2. In general, as shown in a partial schematic cross-sectional view of FIG. 1A, a connecting hole can be formed by forming an insulating layer 7 on a semiconductor substrate 1 or a lower wiring layer and thereafter forming an aperture 8 in the insulating layer 7. The reference numeral 2 denotes an element isolating region; 3, a gate oxide film; 4, a gate electrode; 5, an LDD side wall; 6, a source drain region. Thereafter, a metal wiring material film 9 is formed on the insulating layer 7 including the inside of the aperture 8, for example, with the sputtering method. Thereby, the aperture 8 is filled with the metal wiring material film 9 to complete a connecting hole.

Figure 1A:
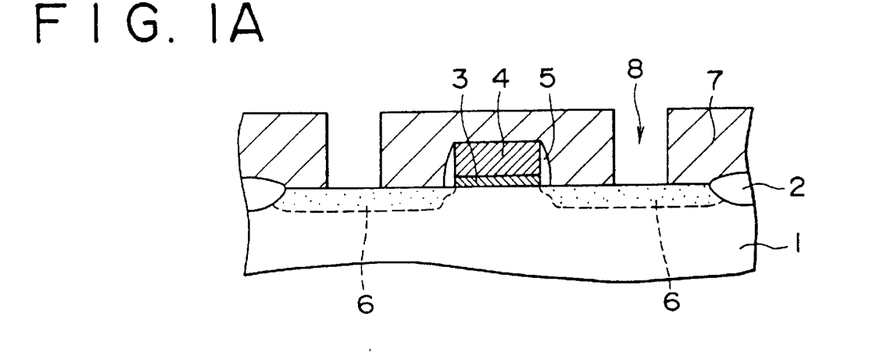
FIG. 1 is a partial schematic cross-sectional view of a semiconductor device of a related art for explaining problems thereof.
Figure 1B:
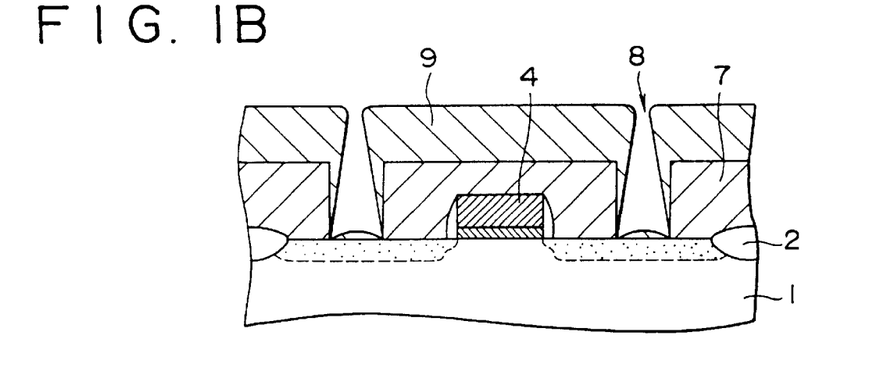

However, when the aspect ratio of the aperture 8 is high, a problem rises here that the metal wiring material is not deposited on at the bottom part of the aperture 8 due to the shadowing effect or that the metal wiring material film is not formed in the sufficient thickness at the side wall of aperture near the bottom part thereof (refer to FIG. 1B). The shadowing effect means a phenomenon that the incident sputtering particles are not deposited on a part so-called an optically shadowed portion of the aperture during the sputtering process. If such problem is generated, reliability for electrical connection of a connecting hole is degraded and connection failure occurs in the connecting hole in the worst case.

A high temperature sputtering method is a typical technology for covering the side wall of an aperture having a high aspect ratio with aluminum or aluminum system alloy (hereinafter called by the general name of Al system alloy). This high temperature sputtering method is effective for heating a semiconductor substrate 1 up to about 500° C. on the occasion of forming a film of the Al system alloy with the sputtering method. As explained above, when the semiconductor substrate 1 is heated, the Al system alloy deposited on the insulating film 7 is fused to become fluid and flows into the aperture 8. As a result, the aperture 8 can be surely filled with the Al system alloy.

Cu or its alloy has a lower resistance than the Al system alloy and shows excellent resistance for electro-migration (EM resistance material). Therefore, Cu or its alloy is very attractive material for future high integration and high-speed semiconductor device. Characteristics of Cu, Ag, Au will be shown in the following table.

|  | Specific resistance (μΩcm) | Melting point (° C.) | Tensile strength (kgf/mm²) | EM resistance | High temp. sputtering/ applicability |
|---|---|---|---|---|---|
| Al system alloy | 3.2 | 650 | 4.8 | Δ | ○ |
| Cu | 1.7 | 1083 | 21.7 | ○ | x |
| Ag | 1.6 | 961 | 12.7 | Δ | x |
| Au | 2.3 | 1063 | 13 | Δ | x |
| W | 10 | 3380 | 60 | ⊙ | x |

In the above table, "⊙" means very excellent characteristics, "○" means excellent characteristics and "Δ" means a little lower characteristics than "○". Cu, Ag and Au have a lower specific resistance and therefore are suitable for realizing high-speed operation of a semiconductor device. Meanwhile, Cu has excellent characteristics for electro-migration resistance and moreover it can be expected to also have excellent stress migration resistance because it has a tensile strength about five times higher than that of Al system alloy. However, Cu, Ag, Au respectively have the melting point as high as about 1000° C. Therefore, it is impossible to bury the aperture with such metal materials using the high temperature sputtering method where a semiconductor substrate is heated up to about 500° C.

In recent years, investigations are continued for reflow method where a semiconductor substrate is heated, after a metal wiring material is deposited on an insulating layer, to fuse the metal wiring material deposited on the insulating layer to become fluid and thereby the aperture can be filled with a film of metal wiring material. Use of such reflow method enables that a high melting point metal wiring material such as Cu is fused to become fluid and thereby the aperture can be buried with a film of the high melting point metal wiring material. Such reflow technology is disclosed, for example, in the reference titled as "Reflow Characteristic of Sputtered Cu Film", p. 769, 29p-ZE-3, Proceedings of the 54th Applied Physics Society of Japan (Autumn). However, in this technology, since the time required for reflow process is as long as 30 minutes, if 25 semiconductor substrates are processed by the single wafer processing type reflow apparatus of the related art, total time of about 13 hours is required and it is too low in the productivity. If the reflow time is shortened, Cu does not reflow into the aperture and voids are generated therein.

In the reflow method, atoms forming a metal wiring material diffuses as the surface and the metal wiring material flows into the aperture when the semiconductor substrate is placed under the heat treatment while the surface condition of the sputtered metal wiring material is cleaned under the vacuum condition. Therefore, if a semiconductor substrate is exposed to the atmospheric condition before execution of the reflow process or is left under the low vacuum environment, an oxide film is formed at the surface of the metal wiring material and it does not flow into the aperture even when the reflow process is executed. For example, it is described in the reference entitled as "Burying by Al Reflow under Ultra-high Vacuum Condition", p. 720, 30a-ZY-8, Proceedings of the 40th Applied Physics Society of Japan (Spring). This reference relates to the technology of aluminum reflow and moreover to a conventional short term reflow process of about 180 seconds.

As explained above, the technology for executing the reflow process to the sputtered Cu film with a single wafer processing type reflow apparatus and the technology for improving the burying characteristic by the aluminum reflow under ultra-high vacuum condition are already known from the references listed above, but so long as the applicant of the present invention has searched, the technology for certainly forming a connecting hole in a semiconductor device with a high productivity using a high melting point metal wiring material such as Cu without deteriorating a throughput is not yet obvious. That is, when a contact hole is to be buried by reflow process of a high melting point material such as Cu, Ag, etc., the process can be stably achieved by raising a temperature or extending the heat treatment time. However, in the former case of raising the temperature, the material, for example, Cu, must be set to the temperature of about 600° C. Under such a high temperature, Si barrier metal easily diffuses into Si. Therefore, in such a reflow process, the latter method is inevitably employed, that is, the heat treatment time is extended. Since the multi-chamber apparatus combining the sputtering apparatus and reflow chamber has employed the single wafer processing mode for processing the wafers one by one, an actual reflow time becomes longer giving adverse effect on the throughput. Therefore, even if a connecting hole is formed with the technologies disclosed in above references by combining the sputtering apparatus and batch type reflow apparatus of the related arts, an oxide film is formed at the surface of the high melting point metal wiring material such as Cu, etc. and the high melting point wiring material does not flow into the aperture when the reflow process is performed to the high melting point metal wiring material such as Cu at the temperature considerably lower than the melting point thereof.

OBJECTS AND SUMMARY OF THE INVENTION

It is a first object of the present invention to provide a multi-chamber apparatus which can certainly perform formation of a high melting point metal material film and reflow process without deteriorating throughput or productivity.

It is a second object of the present invention to provide a multi-chamber apparatus comprising a chamber for simultaneously performing the reflow process to a plurality of wafers.

It is a third object of the present invention to provide a method of certainly forming a connecting hole having high reliability using a high melting point metal wiring material without lowering throughput or productivity.

The above objects can be achieved by a multi-chamber apparatus of the present invention which is characterized in comprising:

(a) a film forming apparatus to form a metal film on a base material under the evacuated condition;

(b) a reflow apparatus for simultaneously reflowing metal films formed on a plurality of base materials under the vacuum atmosphere of $1.3 \times 10^{-6}$ Pa ($1 \times 10^{-8}$ Torr) or less and more preferably under the vacuum atmosphere of $6.7 \times 10^{-6}$ Pa ($5 \times 10^{-8}$ Torr) or less; and (c) a transfer path formed to connect the film forming apparatus and the reflow apparatus under the vacuum atmosphere of $1.3 \times 10^{-6}$ Pa ($1 \times 10^{-8}$ Torr) or less and more preferably under the vacuum atmosphere of $6.7 \times 10^{-6}$ Pa ($5 \times 10^{-8}$ Torr) or less.

In the film forming apparatus of the multi-chamber apparatus of the present invention, it is preferable to form a metal film composed of copper, copper alloy, silver, silver alloy, gold or gold alloy on a base material. The film forming apparatus can be structured by a sputtering apparatus or a vacuum deposition apparatus. Moreover, it is preferable that the reflow apparatus is provided with an infrared lamp or a resistance heater.

The above objects can also be achieved by a method of manufacturing a semiconductor device of the present invention characterized in comprising the steps of:

(a) forming an aperture on an insulating layer formed on a semiconductor substrate and then forming a metal film on the insulating layer within a film forming apparatus under the evacuated condition; and (b) transferring the semiconductor substrate to a reflow apparatus from the film forming apparatus under the vacuum atmosphere of $1.3 \times 10^{-6}$ Pa ($1 \times 10^{-8}$ Torr) or less and more preferably under the vacuum atmosphere of $6.7 \times 10^{-6}$ Pa ($5 \times 10^{-8}$ Torr) or less and thereafter simultaneously heating a plurality of semiconductor substrates under the vacuum atmosphere $1.3 \times 10^{-6}$ Pa ($1 \times 10^{-8}$ Torr) or less and more preferably under the vacuum atmosphere of $6.7 \times 10^{-6}$ Pa ($5 \times 10^{-8}$ Torr) or less to reflow a metal film formed on the insulating layer and thereby to bury or fill the aperture with the metal film.

In a method of manufacturing a semiconductor device of the present invention, it is preferable to form a metal film with copper, copper alloy, silver, silver alloy, gold or gold alloy. A metal film can be formed by the sputtering method or vacuum deposition method. Moreover, the semiconductor substrate can be heated with an infrared lamp or a resistance heater.

In a multi-chamber apparatus or a method of manufacturing a semiconductor device of the present invention, high productivity can be attained by simultaneously reflowing or heating a plurality of base materials or semiconductor substrates. Moreover, since transfer of semiconductor substrates to the reflow apparatus from the film forming apparatus and the reflow process are performed under the atmosphere of the vacuum condition higher than $1.3 \times 10^{-6}$ Pa, the surface of formed metal film can surely be protected from oxidation and the reflow process can certainly be executed to the metal film composed of a high melting point metal wiring material at a low temperature giving no adverse effect on the base material (semiconductor substrate).

DETAILED DESCRIPTION OF THE PREFERRED EMBODIMENTS

The present invention will be explained by way of the preferred embodiments with reference to the accompanying drawings.

Figure 2:
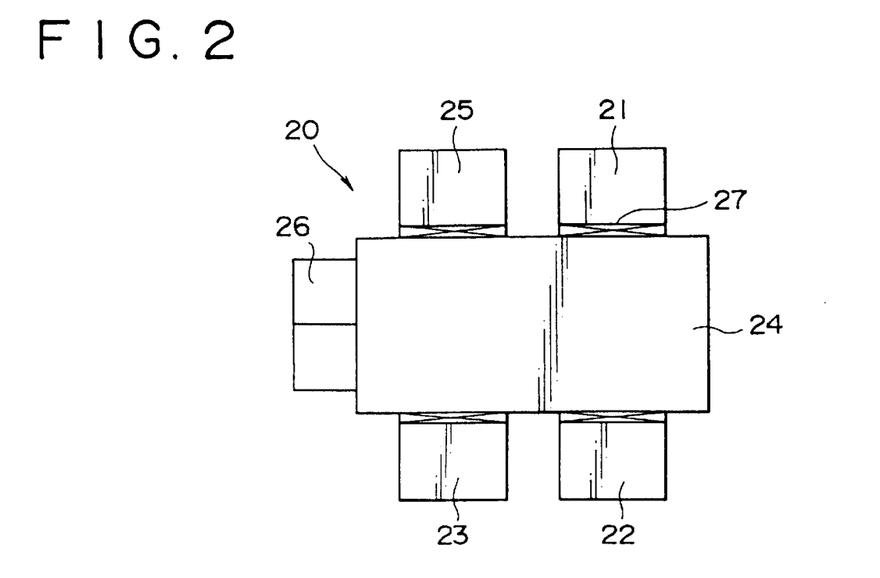
FIG. 2 is a schematic diagram of a multi-chamber apparatus as a first embodiment of the present invention.

A structure of a multi-chamber apparatus 20 as a first embodiment of the present invention is shown in FIG. 2. The multi-chamber apparatus 20 is composed of a film forming apparatus (for example, a first film forming apparatus 21 and a second film forming apparatus 22), a reflow apparatus 23 and a transfer path 24. In the film forming apparatuses 21 and 22, a metal film is formed on a base material under the evacuated condition. In this embodiment, the sputtering apparatuses are used as the film forming apparatuses 21 and 22. In this case, it is permitted to use only one film forming apparatus or three or more film forming apparatuses.

The reflow apparatus 23 simultaneously reflows metal films formed on a plurality of base materials under the vacuum atmosphere of $1.3 \times 10^{-6}$ Pa ($1 \times 10^{-8}$ Torr) or less. Namely, the reflow apparatus 23 is a so-called batch type reflow apparatus. The film forming apparatuses 21 and 22 and the reflow apparatus 23 are connected with a transfer path 24. The inside of the transfer path 24 is maintained at the vacuum atmosphere of $1.3 \times 10^{-6}$ Pa or less. The reflow apparatus 23 and transfer path 24 are evacuated, for example, by a cryopump or turbopump (not illustrated) to ultra-high vacuum atmosphere.

The multi-chamber apparatus can be provided, if necessary, with an RF etching chamber 25 in order to eliminate, before formation of a metal film, an oxide film generated on the surface of a lower layer wiring formed on the base material (or semiconductor substrate). In FIG. 2, the reference numeral 26 denotes a load lock chamber through which the base material (or semiconductor substrate) is carried into the transfer path 24. The reference numeral 27 (42) denotes a slide valve for separating the film forming apparatuses 21 and 22, reflow apparatus 23 from the transfer path 24. The multi-chamber apparatus is also provided with a transfer apparatus for transferring the base material (semiconductor substrate) but it is not illustrated.

A second embodiment of the present invention will then be explained hereunder.

Figure 3:
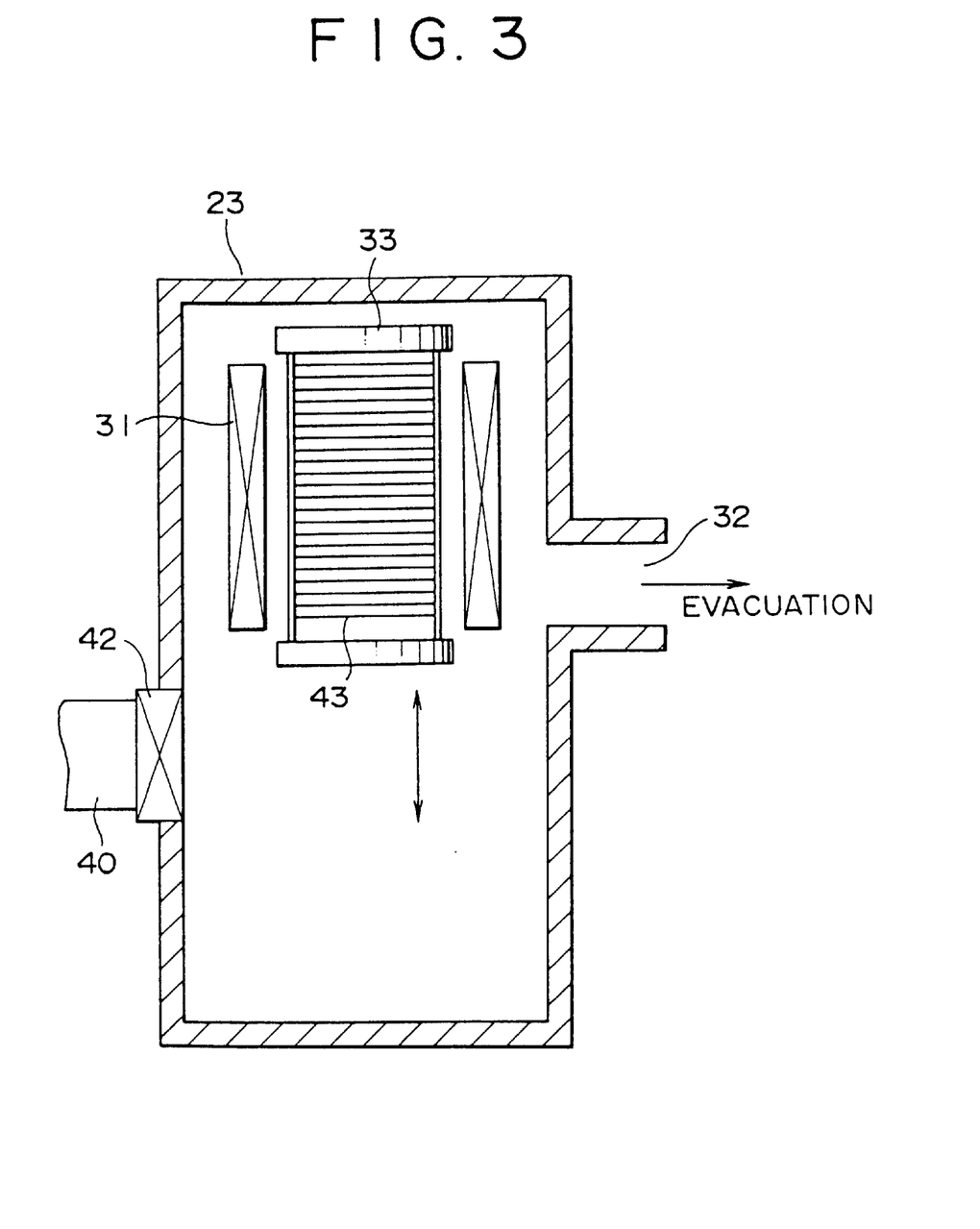
FIG. 3 is a schematic diagram of a reflow apparatus to form a multi-chamber apparatus as a second embodiment of the present invention.

FIG. 3 is a schematic diagram of a partially cutout reflow apparatus 23. In the reflow apparatus 23, a plurality of infrared lamps are provided to heat base materials (semiconductor substrates 43) to the predetermined temperature. The reflow apparatus 21 is also provided with an evacuating part 32 which is connected to a cryopump or turbopump (not illustrated). Moreover, a quartz carrier 33 for accommodating base materials (semiconductor substrates 43) is also arranged within the reflow apparatus 23. The carrier 33 is vertically moved within the reflow apparatus 23 with a lifting device not illustrated.

Next, a third embodiment of the present invention will be explained.

Figure 4A:
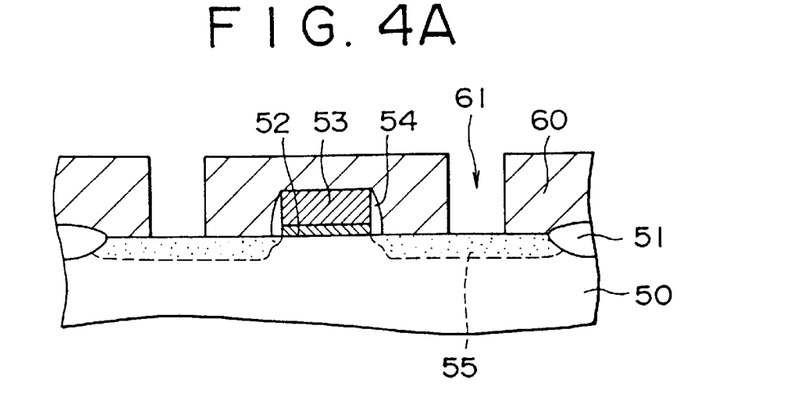
FIGS. 4A to 4C are partial schematic cross-sectional views of a semiconductor substrates for explaining each process of a method of manufacturing a semiconductor device as a third embodiment of the present invention.
Figure 4B:
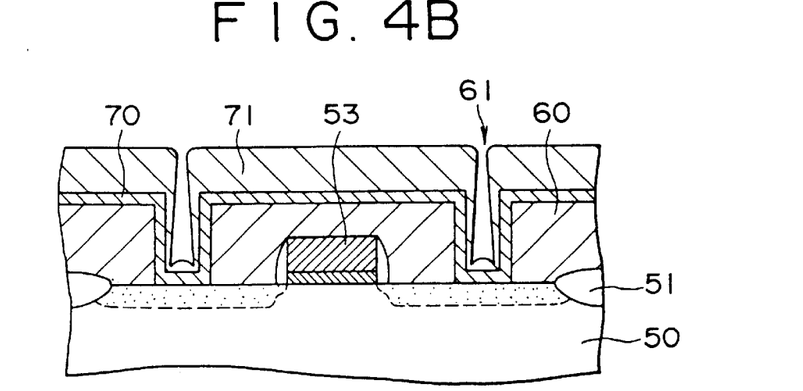
Figure 4C:
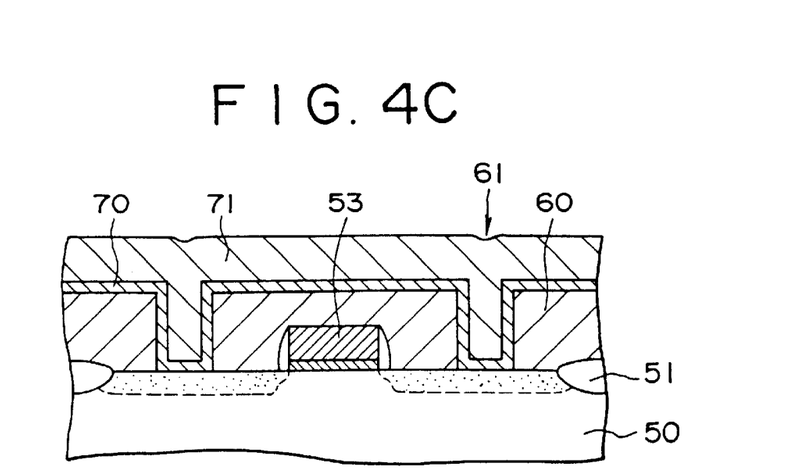

A method of manufacturing a semiconductor device of the present invention utilizing the multi-chamber apparatus 20 and reflow apparatus 23 shown in FIG. 2 and FIG. 3 will then be explained with reference to FIGS. 4A to 4C which are schematic diagrams of a partial cross-sectional view of a semiconductor substrate, etc. In this embodiment, a semiconductor device is composed of a MOS transistor forming therein a contact hole. In the case of this embodiment, a metal film composed of copper (Cu) is formed by the sputtering method. An insulating film 60 formed on the semiconductor substrate 50 corresponds to the base material.

[Process-100]

First, an element isolating region 51 is formed by the conventional LOCOS method on a silicon semiconductor substrate 50 and thereafter the surface of silicon semiconductor substrate 50 is oxidized to form a gate oxide film 52. Next, after polysilicon is deposited to the entire surface, for example, by the CVD method, a gate electrode 53 consisting of polysilicon is then formed by the photolithography and dryetching technology. Thereafter, in view of forming an LDD structure, impurity ion is implanted and a side wall 54 consisting of $SiO_2$ is provided at the side wall of the gate electrode 53. Next, impurity ion is implanted to form a source drain region 55 on the silicon semiconductor substrate 50. Thereafter, in insulating layer 60 consisting, for example, of $SiO_2$ is formed on the entire surface by the CVD method.

[Process-110]

Next, an aperture 61 is formed to the insulating layer 60 at the upper part of the source drain region 55 formed on the semiconductor substrate 50. This aperture 61 can be formed by the photolithography and dryetching technology. This condition is illustrated in FIG. 4A.

[Process-120]

A silicon semiconductor substrate 50 on which the aperture 61 is formed as explained above is then carried into the transfer path 40 through the load lock chamber 41. The transfer path 40 is evacuated by a cryopump or turbopump to the vacuum atmosphere of $1.3 \times 10^{-6}$ Pa ($1 \times 10^{-8}$ Torr) or less and more preferably to the vacuum atmosphere of $6.7 \times 10^{-6}$ Pa ($5 \times 10^{-8}$ Torr) or less. First, a silicon semiconductor substrate 43 is carried into a first film forming apparatus from the transfer path 40 through a slide valve 42. In the first film forming apparatus 21, a wettability improving layer 70 is formed on the insulating layer 60 including the aperture 61. This wettability improving layer 70 is composed of tungsten (W) in view of improving fluidity during the reflow process of a metal film to be formed next and is composed of copper (Cu). This wettability improving layer 70 has a thickness of 70 nm. The forming conditions of the wettability improving layer 70 are as follows.

| | |
|---|---|
| Target: | W |
| Process gas: | Ar |
| Pressure: | 0.4 Pa |
| DC power: | 4 kW |
| Base material temperature: | 100° C. |

[Process-130]

After formation of the wettability improving layer 70, the silicon semiconductor substrate 50 is carried into a second film forming apparatus 22 through the transfer path 40 and slide valve 42. In the second film forming apparatus, a metal film consisting of Cu is formed under the evacuated condition (refer to FIG. 4B). Thickness of the metal film 71 is determined to 400 nm on the insulating film 60. The forming conditions of the metal film 71 are as follows.

| | |
|---|---|
| Target: | Cu |
| Process gas: | Ar |
| Pressure: | 0.4 Pa |
| DC power: | 10 kW |
| Base material temperature: | 25° C. |

[Process-140]

After formation of the metal film 71, the silicon semiconductor substrate 50 is carried into the reflow apparatus 23 from the second film forming apparatus 22 through the slide valve 42, transfer path 40 and the slide valve 42. The transfer path 40 is maintained under the vacuum atmosphere of $1.3 \times 10^{-6}$ Pa ($1 \times 10^{-8}$ Torr) or less and more preferably $6.7 \times 10^{-6}$ Pa ($5 \times 10^{-8}$ Torr) or less. Meanwhile, the inside of the reflow apparatus 23 is also maintained under the vacuum atmosphere of $1.3 \times 10^{-6}$ Pa ($1 \times 10^{-8}$ Torr) or less and more preferably $6.7 \times 10^{-6}$ Pa ($5 \times 10^{-8}$ Torr) or less. Thereby, formation of an oxide film on the surface of the metal film 71 composed of Cu can certainly be prevented.

[Process-150]

The predetermined number (for example, 25) of silicon semiconductor substrates 43 are sequentially accommodated in the carrier 33 located at the lower position in the reflow apparatus 23 and these silicon semiconductor substrates 43 are maintained in this carrier 33. After the predetermined number of silicon semiconductor substrates 43 are housed in the carrier 33, the carrier 33 is then located at the lifted position with a lifting device not illustrated (this condition is shown in FIG. 3). Thereafter, the metal film 71 consisting of Cu is heated, that is, the metal film 71 consisting of Cu formed on the insulating film 60 (more practically on the wettability improving layer 70 in the third embodiment) is heated for the purpose of reflow. Thereby, the metal film 71 is melted to become fluid in view of burying the aperture 61 with the metal film 71 (refer to FIG. 4C). Moreover, the surface of the metal film 71 formed on the insulating film 60 is smoothed. The reflow process conditions are as follows.

| | |
|---|---|
| Pressure: | $1.3 \times 10^{-6}$ Pa ($1 \times 10^{-8}$ Torr) |
| Temperature: | 450° C. |
| Time: | 30 min. |

Thereafter, the metal film 71 and wettability improving layer 70 formed on the insulating layer 60 are patterned into the predetermined shape with the photolithography and dryetching technology to form an upper wiring layer on the insulating layer 60.

For instance, the reflow process has been attempted for the Cu metal 71 within the reflow apparatus 23 in the same process only except for that the inside of the transfer path 24 and reflow apparatus 23 is maintained under the vacuum atmosphere of $1.3 \times 10^{-5}$ Pa ($1 \times 10^{-7}$ Torr). However, cleanliness at the surface of the metal film 71 is deteriorated and the aperture 61 cannot be certainly buried with the metal film 71.

Figure 5:
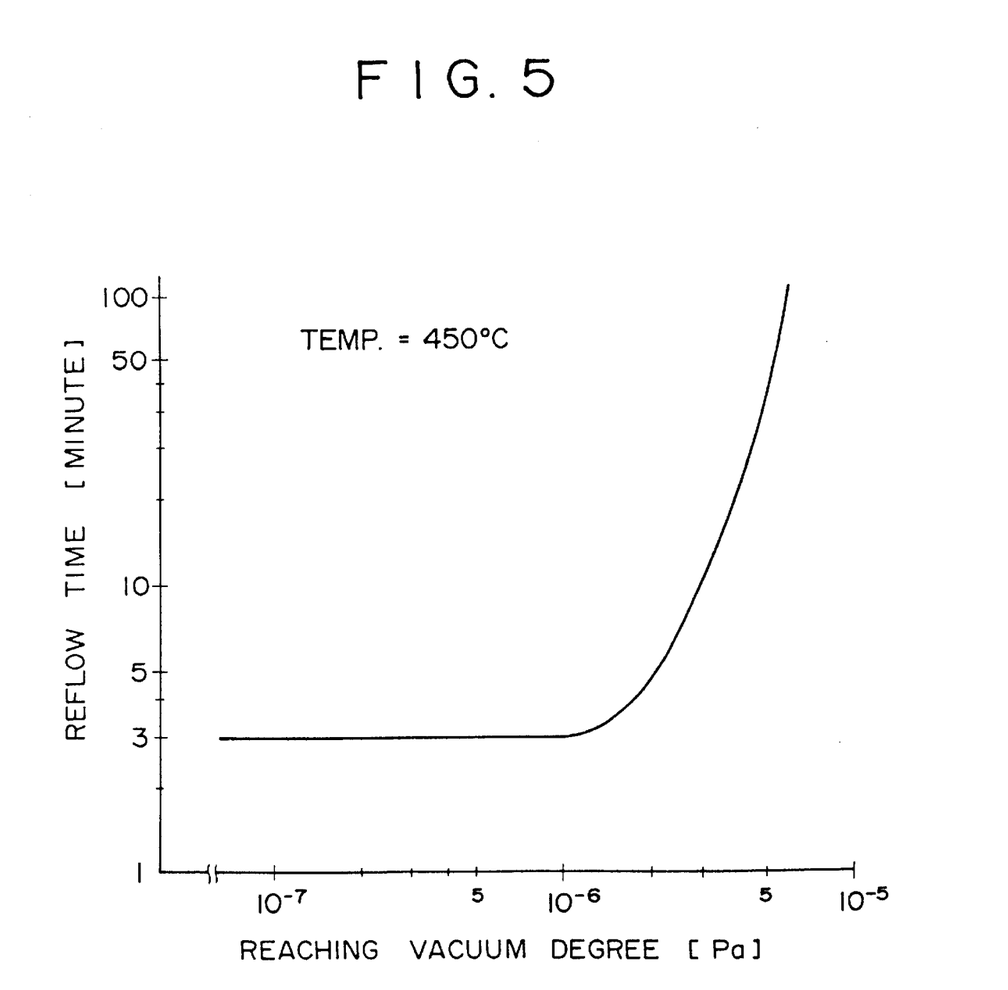
FIG. 5 is a characteristic diagram indicating a relationship between a reflow time and a vacuum condition.

Then, FIG. 5 will then be explained. About 3 minutes is required for covering the internal surface of a hole, for example, in the depth of about 500 nm with aluminum metal film under the condition of about 450° C. and $1 \times 10^{-6}$ Pa.

Here, investigation will be made under the condition, for example, that the temperature is set constant to 450° C. As can be understood from the graph of FIG. 5, the target vacuum degree is about $10^{-5}$ Pa or less for the reflow. If the vacuum condition becomes higher, the surface diffusion is controlled with contamination at the surface and the reflow does not occur. Meanwhile, even if a vacuum condition is simply increased, the reflow time cannot always be shortened. Since the reflow time also depends on the diffusion coefficient, a certain minimum time is necessary. When the vacuum degree becomes about $3 \times 10^{-5}$ Pa or less under the above conditions, the reflow time suddenly becomes longer, making difficult the manufacturings.

Next, the fourth embodiment of the present invention will be explained.

This embodiment is a variation of the method of manufacturing a semiconductor device explained with reference to FIG. 3. In this embodiment, the wettability improving layer 70 is formed in the triple-layer structure consisting of the Ti layer, TiN layer and W layer from the lower side. In the fourth embodiment, a semiconductor device can also be manufactured with the method of manufacturing semiconductor device explained with reference to FIG. 3, only except for the difference of the forming conditions of the wettability improving layer 70 using the multi-chamber apparatus explained in the second embodiment. Only the forming conditions of the wettability improving layer 70 in the fourth embodiment are indicated hereunder.

| Ti layer forming conditions: | |
|---|---|
| Target: | Ti |
| Process gas: | Ar |
| Pressure: | 0.4 Pa |
| DC power: | 4 kW |
| Temperature of base material: | 100° C. |
| TiN layer forming conditions: | |
| Target: | Ti |
| Process gas: | Ar-60% N2 |
| Pressure: | 0.4 Pa |
| DC power: | 10 kW |
| Temperature of base material: | 150° C. |
| W layer forming conditions: | |
| Target: | W |
| Process gas: | Ar |
| Pressure: | 0.4 Pa |
| DC power: | 4 kW |
| Temperature of base material: | 100° C. |

Figure 6:
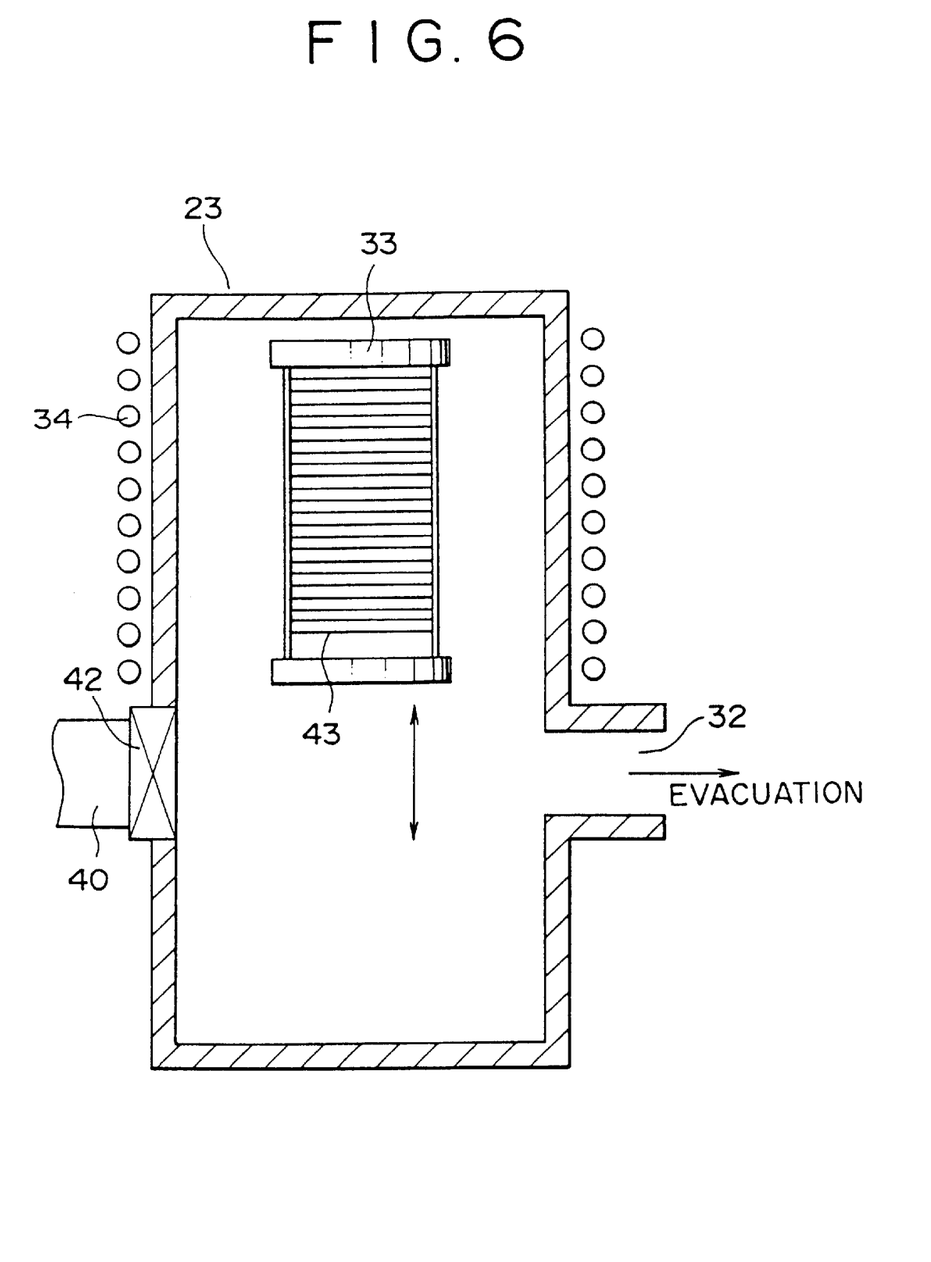
FIG. 6 is a schematic diagram of a reflow apparatus to form a multi-chamber apparatus as a fifth embodiment of the present invention.

Next, the fifth embodiment will then be explained with reference to FIG. 6.

This embodiment is a variation of the multi-chamber apparatus explained in the second embodiment. The reflow apparatus in this embodiment is provided with a resistance heater 34 using a kanthal lead (FeCrAl). Since the other structure is the same as the multi-chamber apparatus explained in the first embodiment and is not explained her. Moreover, the method of manufacturing a semiconductor device using the multi-chamber apparatus of the present invention is also the same as that explained in the third and fourth embodiments, except for that a semiconductor substrate is heated with a resistance heater.

Figure 7:
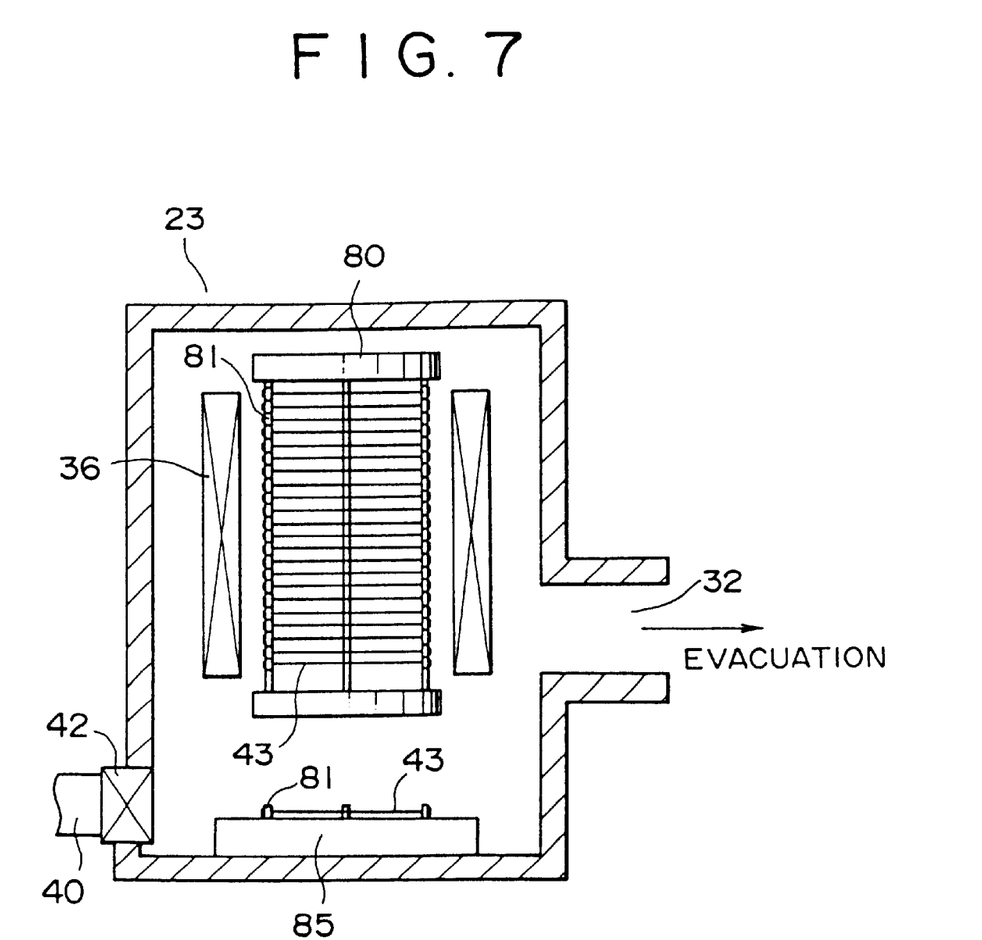
FIG. 7 is a schematic diagram of a reflow apparatus to form a multi-chamber apparatus as a sixth embodiment of the present invention.

Next, the sixth embodiment of the present invention is a variation of the multi-chamber apparatus explained in the second embodiment and relates to an improvement of the reflow apparatus. In the sixth embodiment, as is schematically shown in FIG. 7, the carrier 80 is composed of a carrier unit 81 which can be separated for each semiconductor substrate. A total side of the reflow apparatus can be reduced by introducing a structure where a plurality of carrier units 81 are vertically stacked.

Next, the seventh embodiment of the present invention will be explained.

Figure 8A:
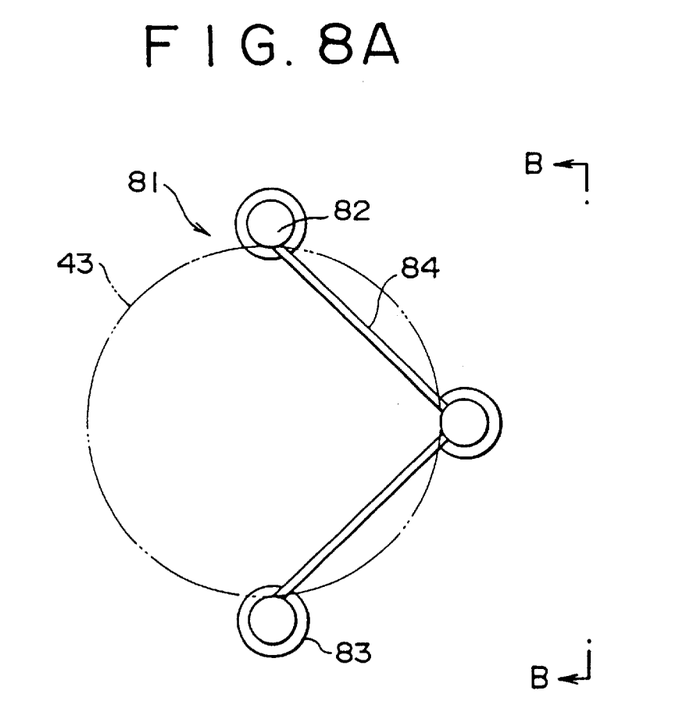
FIGS. 8A and 8B are schematic plan view and side elevation of a carrier unit as a seventh embodiment of the reflow apparatus shown in FIG. 7.

FIG. 8A is a schematic plan view of the carrier unit 81.

Figure 8B:
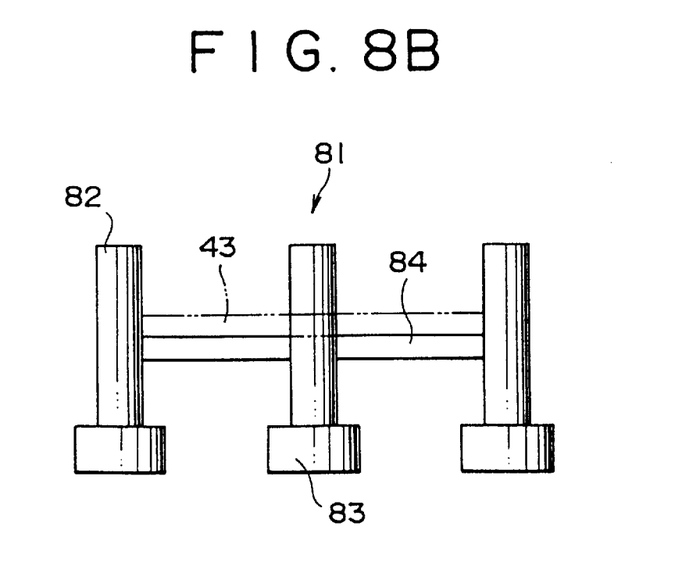

FIG. 8B is a schematic side elevation of the carrier unit 81 viewed along the line B—B of FIG. 8A. The carrier unit 81 is composed of a plurality of quartz poles 82 (three poles in the fourth embodiment) and a plurality of quartz pole coupling rods 84 (two rods in the fourth embodiment) for coupling these poles. The pole 82 is arranged in the equal interval on the semicircle of the diameter a little smaller than that of the semiconductor substrate 43 (indicated by a virtual line). Height of the pole 82 is equal to the distance required between the semiconductor substrate for the reflow process. The lower part 83 of the pole 82 has a structure being fitted with a head portion of the pole 82 of the other carrier unit 81. The pole coupling rod 84 couples the poles 82 and simultaneously works as the supporting body to support the semiconductor substrate 43. Namely, a sheet of semiconductor substrate 43 is held with one carrier unit 81. It is also possible to form the pole coupling rod 84 as a multistage rod and mount the semiconductor substrates 43 as many as the number of stages in the carrier unit 81. Moreover, arrangement of a plurality of poles 82 can be changed as desired.

The base material (semiconductor substrate 50) carried into the lower part 85 of the reflow apparatus through the slide valve 42 from the transfer path 40 is then loaded on the carrier unit 81 with a loading means not illustrated. This carrier unit 81 is lifted up to the center of the reflow apparatus with the lifting means not illustrated and the carrier units 81 are stacked one by one from the lower side at the center of the reflow apparatus. FIG. 7 illustrates the carrier 80 where the specified number of carrier units 81 are stacked. After the specified number of carrier units 81 are stacked, the reflow process is executed for the base materials (semiconductor substrates 43).

After completion of the reflow process, the carrier units 81 stacked at the center of the reflow apparatus are sequentially moved downward one by one to the lower part 85 of the reflow apparatus with the lifting device not illustrated. Thereafter the base material (semiconductor substrate 43) is unloaded from the carrier unit 81 with an unloading means not illustrated and is then carried to the transfer path 40 via the slide valve 42.

In the reflow apparatus of the sixth embodiment or the eighth embodiment to be explained next, a resistance heater 24 may be arranged in place of the infrared lamp 21.

The eighth embodiment of the present invention will then be explained with reference to FIG. 8.

Figure 9:
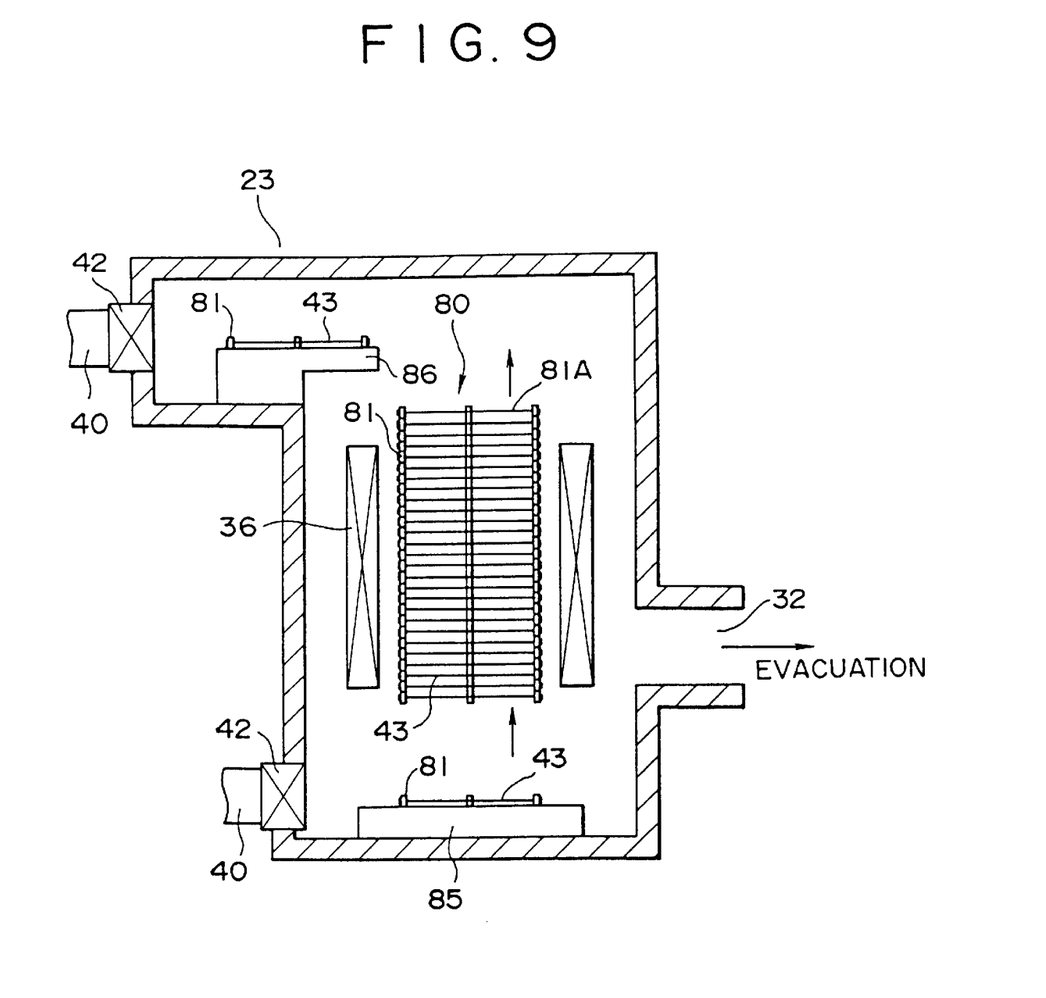
FIG. 9 is a schematic diagram of a reflow apparatus to form a multi-chamber apparatus as an eighth embodiment of the present invention.

This embodiment is a variation of the multi-chamber apparatus explained in the sixth embodiment and relates to further improvement of the reflow apparatus 23. Also, in this embodiment, the carrier 80 is composed of the carrier unit 81 which may be separated for each semiconductor substrate. This embodiment is different from the embodiment 6 in the point that while each stacked carrier unit 81 is lifted from the lower part, for example, in the reflow apparatus, the reflow process is executed to each base material (semiconductor substrate 43) loaded on each carrier unit 81.

The base material (semiconductor substrate 43) carried to the lower part 85 of the reflow apparatus via the lower slide valve 42 from the transfer path 40 is loaded on the carrier unit 81 with the transfer means not illustrated. Such carrier unit 81 is then moved to the lower part of the reflow apparatus with the lifting means not illustrated. The carrier 80 is structured by fitting the head portion of the pole of this carrier unit 81 with the lower part of the pole of the carrier unit of the lowest stage of the stacked carrier unit.

The carrier 80 lifted continuously or step by step at the predetermined speed with the lifting mechanism not illustrated. While the carrier 80 is being lifted, the reflow process is executed to the base material (semiconductor substrate 43) loaded in the carrier unit 81.

On the other hand, the carrier unit 81A of the upper most stage of the stacked carrier unit is taken from the carrier 80 with a takeout means not illustrated and is then carried to the upper part 86 of the reflow apparatus with the transfer apparatus not illustrated. The base material (semiconductor substrate 43) is unloaded from the carrier unit 81 with the unloading means and is then carried to the transfer path 40 through the upper slide valve 42.

By constituting the reflow apparatus as explained above, fluctuation of the reflow process for each base material (semiconductor substrate 43) can be minimized and moreover the processing capability of the reflow apparatus can be reinforced. It is also possible that the base material (semiconductor substrate 43) is carried into the reflow apparatus from the upper slide valve 42 and the carrier 80 is then moved downward to take out the base material (semiconductor substrate 43) from the lower slide valve 42.

It is also possible that a plurality of reflow apparatuses are arranged in parallel, the lower portions and/or upper portions of these reflow apparatuses are coupled with the slide valves and transfer paths and the base materials (semiconductor substrates) are carried into the reflow apparatus 20 and is then taken out from the other reflow apparatus. Thereby, the reflow process can be executed more effectively with a higher through top using a plurality of small size reflow apparatuses.

The preferred embodiments of the present invention have been explained above but the present invention is not limited thereto. As a method of manufacturing a semiconductor device in each embodiment, a contact hole, which is provided to electrically connect the source drain region 55 formed on the semiconductor substrate 43 and a wiring layer formed on such region has been explained by way of example, but the method of manufacturing a semiconductor device of the present invention is not limited thereto. For instance, a via hole and a through hole for connecting a lower wiring layer formed on the insulating layer and an upper wiring layer formed on the other insulating layer formed on such lower wiring layer can also be formed by the method of manufacturing a semiconductor device of the present invention. In this case, an aperture is formed on the other insulating layer.

As a material to constitute a metal film, copper alloy such as Cu—Ti, Cu—Al, Cu—Si, Cu—Ta, silver (Ag), silver alloy such as Ag—Al, Ag—Si, Ag—Cu, gold (Au), gold alloy such as Au—Si, Au—Al can be listed as well as copper (Cu). Moreover, as the wettability improving layer, Ti, W, Ta, TiW, TiN, WN or the material laminating these layers can also be listed.

As the sputtering apparatus to form a metal film, various sputtering apparatuses such as diode sputtering apparatus, triode or tetrode sputtering apparatus, magnetron sputtering apparatus, high frequency sputtering apparatus, reactive sputtering apparatus, asymmetrical AC sputtering apparatus, getter sputtering apparatus, DC sputtering apparatus, RF sputtering apparatus, ECR sputtering apparatus and a bias sputtering apparatus for impressing a substrate bias can be listed and a metal film can be formed by the sputtering method using such a sputtering apparatus. Otherwise, a metal film may be formed by the vacuum deposition method in place of the sputtering method. The vacuum deposition apparatus can be constituted, for example, by a wire for loading a vacuum deposition material or boat and crucible for accommodating a vacuum deposition material, and a resistance heating means, high frequency heating means or electron beam heating means.

Moreover, as a film forming apparatus, a low pressure CVD apparatus, plasma CVD apparatus and optical CVD apparatus can be listed. A film can also be formed by the low pressure CVD method, plasma CVD method or optical CVD method, etc. For example, the film forming conditions in such a case as forming a metal film of Cu or Ag with the CVD method are as follows.

| Cu film forming conditions: | |
|---|---|
| Gas used: | Cu $(HFA)_2/H_2$ = 10/1000 sccm |
| Pressure: | $2.6 \times 10^3$ Pa |
| Base material heating temperature: | 350° C. |
| Power: | 500 W |
| Ag film forming conditions: | |
| Raw material: | $Ag_2CO_3$ |
| Raw material source temperature: | 170° C. |
| Gas used: | $Ag_2CO_3/Ar/H_2$ = 10/25/1000 sccm |
| Pressure: | $2.6 \times 10^3$ Pa |
| Base material heating temperature: | 450° C. |

HFA is abbreviation of hexafluoroacetylacetonate.

As an insulating film, the known insulating material such as BPSG, PSG, BSG, AsSG, PbSG, SbSG, SOG, SiON or SiN or those obtained by laminating these can also be listed, in addition to $SiO_2$.

The multi-chamber apparatus of the present invention can execute the reflow process simultaneously for a plurality of base materials (semiconductor substrates) and can also remarkably improve the throughput. For instance, when 25 semiconductor substrates are processed with the single wafer processing type reflow apparatus as a related art, 13 hours are required, but the reflow process can be completed within an hour by utilizing the multi-chamber apparatus of the present invention. Moreover, since the transfer and reflow processes are carried out in the film forming apparatus to the reflow apparatus under the vacuum atmosphere higher than $1.3 \times 10^{-6}$ Pa, oxidation of the metal film surface can certainly be prevented and the reflow process can be executed to the metal film at a low temperature giving no adverse effect on the base material (semiconductor substrate). As a result, the aperture can certainly be buried with a metal film consisting of a high melting temperature melting wiring material and highly reliable and low resistance wiring structure can be formed without giving any damage on the base material (semiconductor substrate).

Moreover, the surface of metal film having completed the reflow process has rather small unevenness and can control generation of failure due to halation of the exposing beam in the photolithography process on the occasion of forming the predetermined pattern on the metal film. In addition, the metal film having completed reflow process has excellent crystal orientation and therefore has excellent electromigration resistance.

What is claimed is:

1. A method of manufacturing a semiconductor device comprising the steps of:

(a) forming an aperture on an insulating layer formed on a semiconductor substrate and thereafter forming a metal film on said insulating layer under a low pressure condition in a film forming apparatus; and (b) transferring said semiconductor substrate from the film forming apparatus to a reflow apparatus under a vacuum atmosphere of $1.3 \times 10^{-6}$ Pa or less; and (c) heating simultaneously a plurality of semiconductor substrates under the vacuum atmosphere of $1.3 \times 10^{-6}$ Pa or less in said reflow apparatus with a heating element selected from the group consisting of an infrared lamp and a resistance heater to execute the reflow process to the metal film formed on the insulating layer to fill the aperture with the metal film.

2. A method of manufacturing a semiconductor device according to claim 1, wherein a metal film composed of copper, copper alloy, silver, silver alloy, gold or gold alloy is formed.

3. A method of manufacturing a semiconductor device according to claim 2, wherein said metal film is formed by the sputtering method or vacuum deposition method.

4. A method of manufacturing a semiconductor device comprising the steps of:

(a) forming an aperture in an insulating layer formed on a semiconductor substrate and thereafter forming a first metal film on said insulating layer in a film forming apparatus of a multi-chamber apparatus;

(b) forming a second metal film on said first metal film under a low pressure condition in the film forming apparatus of the multi-chamber apparatus;

(c) transferring said semiconductor substrate to a reflow apparatus of the multi-chamber apparatus from said film forming apparatus under a vacuum atmosphere of $1.3 \times 10^{-6}$ Pa or less; and (d) heating simultaneously a plurality of semiconductor substrates under the vacuum atmosphere of $1.3 \times 10^{-6}$ Pa or less to execute the reflow process in said reflow apparatus with a heating element selected from the group consisting of an infrared lamp and a resistance heater to the metal film formed on the insulating layer to fill the aperture with the metal film.

5. A method of manufacturing a semiconductor device according to claim 4, wherein said second metal film composed of copper, copper alloy, silver, silver alloy, gold or gold alloy is formed.

6. A method of manufacturing a semiconductor device according to claim 5, wherein said second metal film is formed by the sputtering method or vacuum deposition method.

7. A method of manufacturing a semiconductor device according to claim 4, wherein said first metal film is constituted by three layers of Ti layer, TiN layer and W layer.

* * * * *